(12) United States Patent
Yang

(10) Patent No.: US 7,224,057 B2
(45) Date of Patent: May 29, 2007

(54) THERMAL ENHANCE PACKAGE WITH UNIVERSAL HEAT SPREADER

(75) Inventor: Ching-Hsu Yang, Taichung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 61 days.

(21) Appl. No.: 10/657,132

(22) Filed: Sep. 9, 2003

(65) Prior Publication Data

US 2004/0084763 A1  May 6, 2004

(30) Foreign Application Priority Data

Nov. 5, 2002  (TW) ................... 09113262

(51) Int. Cl.
| | |
|---|---|
| H01L 23/495 | (2006.01) |
| H01L 23/12 | (2006.01) |
| H01L 23/15 | (2006.01) |
| H01L 23/10 | (2006.01) |
| H01L 23/34 | (2006.01) |
| H01L 23/28 | (2006.01) |
| H01L 21/00 | (2006.01) |

(52) U.S. Cl. .............. 257/707; 257/675; 257/704; 257/705; 257/706; 257/718; 257/719; 257/720; 257/721; 257/722; 257/796; 438/122

(58) Field of Classification Search ............ None
See application file for complete search history.

(56) References Cited

U.S. PATENT DOCUMENTS

| | | | | |
|---|---|---|---|---|
| 4,069,498 A | * | 1/1978 | Joshi ................... | 257/713 |
| 5,105,259 A | * | 4/1992 | McShane et al. ......... | 257/667 |
| 5,147,821 A | * | 9/1992 | McShane et al. ...... | 264/272.17 |
| 5,265,321 A | * | 11/1993 | Nelson et al. .............. | 29/841 |
| 5,485,037 A | * | 1/1996 | Marrs ....................... | 257/712 |
| 5,504,652 A | * | 4/1996 | Foster et al. ............... | 361/704 |
| 5,525,548 A | * | 6/1996 | Nishiguchi ................ | 438/118 |
| 5,615,086 A | * | 3/1997 | Collins et al. ............. | 361/704 |
| 5,620,767 A | * | 4/1997 | Harigaya et al. .......... | 428/64.4 |
| 5,652,461 A | * | 7/1997 | Ootsuki et al. ............ | 257/675 |
| 5,814,536 A | * | 9/1998 | Rostoker et al. ........... | 438/122 |
| 5,847,928 A | * | 12/1998 | Hinshaw et al. ........... | 361/704 |
| 5,909,057 A | * | 6/1999 | McCormick et al. ....... | 257/704 |
| 5,933,710 A | * | 8/1999 | Chia et al. ................. | 438/123 |
| 5,982,621 A | * | 11/1999 | Li ............................. | 361/704 |
| 6,075,289 A | * | 6/2000 | Distefano .................. | 257/732 |
| 6,075,699 A | * | 6/2000 | Rife .......................... | 361/704 |

(Continued)

FOREIGN PATENT DOCUMENTS

| | | | |
|---|---|---|---|
| JP | 358176959 | * | 10/1983 |
| JP | 404263457 | * | 9/1992 |
| JP | 08213520 | * | 8/1996 |

Primary Examiner—Carl Whitehead, Jr.
Assistant Examiner—James Mitchell
(74) Attorney, Agent, or Firm—Bacon & Thomas, PLLC

(57) ABSTRACT

A thermal enhance semiconductor package with a universal heat spreader mainly comprises a carrier, a semiconductor chip and a universal heat spreader. The semiconductor chip is electrically connected to the carrier in a flip-chip fashion and the universal heat spreader is mounted on the back surface of the semiconductor chip. Therein the universal heat spreader has a plurality of through holes for upgrading the efficiency of heat transmission. Moreover, a heat transmission pin is provided in one of the through holes to increase the areas for heat dissipation so as to enhance the thermal performance of the package.

20 Claims, 3 Drawing Sheets

U.S. PATENT DOCUMENTS

| | | | |
|---|---|---|---|
| 6,084,178 A * | 7/2000 | Cromwell | 174/35 R |
| 6,172,872 B1 * | 1/2001 | Katsui | 361/695 |
| 6,190,945 B1 * | 2/2001 | Akram | 438/122 |
| 6,208,513 B1 * | 3/2001 | Fitch et al. | 361/704 |
| 6,269,003 B1 * | 7/2001 | Wen-Chen | 361/704 |
| 6,357,514 B1 * | 3/2002 | Sasaki et al. | 165/80.3 |
| 6,404,634 B1 * | 6/2002 | Mann | 361/704 |
| 6,410,981 B2 * | 6/2002 | Tao | 257/704 |
| 6,426,548 B1 * | 7/2002 | Mita et al. | 257/673 |
| 6,442,026 B2 * | 8/2002 | Yamaoka | 361/704 |
| 6,449,151 B1 * | 9/2002 | Chen | 361/697 |
| 6,597,063 B1 * | 7/2003 | Shimizu et al. | 257/687 |
| 6,608,380 B2 * | 8/2003 | Ro et al. | 257/712 |
| 6,728,103 B1 * | 4/2004 | Smedberg | 361/703 |
| 6,730,998 B1 * | 5/2004 | Williams et al. | 257/712 |
| 6,757,181 B1 * | 6/2004 | Villanueva et al. | 361/816 |
| 2002/0109219 A1 * | 8/2002 | Yang et al. | 257/712 |
| 2002/0125564 A1 * | 9/2002 | Shibata | 257/706 |
| 2002/0185748 A1 * | 12/2002 | Akram et al. | 257/778 |
| 2003/0134454 A1 * | 7/2003 | Houle | 438/122 |
| 2003/0143382 A1 * | 7/2003 | Xu | 428/209 |
| 2003/0179548 A1 * | 9/2003 | Becker et al. | 361/704 |

* cited by examiner

THERMAL ENHANCE PACKAGE WITH UNIVERSAL HEAT SPREADER

BACKGROUND OF THE INVENTION

1. Field of Invention

This invention relates to a semiconductor package. More particularly, the present invention is related to a thermal enhance semiconductor package with a universal heat spreader having through holes and heat transmission pins therein.

2. Related Art

Integrated circuit (chip) packaging technology is becoming a limiting factor for the development in packaged integrated circuits of higher performance. Semiconductor package designers are struggling to keep pace with the increase in pin count, size limitations, low profile, and other evolving requirements for packaging and mounting integrated circuits.

Originally, in the conventional semiconductor package, the active surface of the chip faces down and is attached to the carrier via metal bumps or solder bumps so as to electrically connect the chip and the carrier. Due to short electrical connection paths between the chip and the carrier, small package size, easy control for high frequency noise and lower signal delays, the flip chip technology is broadly utilized in the recent days.

As we know, the conventional flip chip package is characterized in that the back surface of the chip is directly exposed to the outside without disposing any further heat spreader on the back surface of the chip. Accordingly, it is easy to cause the chip to be damaged due to lack of protective layer on the chip. Furthermore the heat arisen out of the chip is accumulated inside and the heat can't be transmitted to the outside. Thus the life of the chip will be shortened.

Additionally, in order to upgrade the efficiency of the heat dissipation, flip chip package can be in the form of another types. As shown in FIG. 1, a high performance flip chip ball grid array package (HF-BGA) is disclosed. Such semiconductor package 1 mainly comprises a carrier 11, a semiconductor chip 12, a plurality of solder bumps 13, an underfill 14 and a heat spreader 15. The semiconductor chip 12 is flipped and faced down, and electrically connected to the carrier 11 via the solder bumps 13. And the underfill 14 is filled and disposed between the semiconductor chip 12 and the carrier 13 so as to lower the thermal stress caused by the change of the temperature.

Furthermore, the solder balls 16 are disposed on the surface opposed to the surface for the chip being attached thereon and electrically connected to other external devices. And the heat spreader 15 is attached to the semiconductor chip 12 by the heat transmission adhesive 17 so that the heat arisen out of the semiconductor chip 12 can be transmitted to the outside through the heat transmission adhesive 17 and the heat spreader 15. Besides, a stiffener ring 18 is provided on the carrier 11 so as to support the heat spreader 15 and to prevent the heat spreader 15 being tilted.

Next, referring to FIG. 2, a similar semiconductor package is disclosed. When the size of the semiconductor chip 22 is large enough that the stiffener ring can be eliminated. It should be noted that the reference numeral of each element in FIG. 2 corresponds to the reference numeral of each element in FIG. 1.

As shown in FIG. 1, the heat arisen out of the semiconductor chip 12 is transmitted to the outside not only through the back surface of the semiconductor chip 12 and the heat transmission adhesive 17 but also through the stiffener ring 18, the carrier 11 and the solder balls 16. And, as shown in FIG. 2, the heat arisen out of the semiconductor chip 22 is transmitted to the outside not only through the back surface of the semiconductor chip 22 and the heat transmission adhesive 27 but also through the carrier 21 and the solder balls 26. Furthermore the heat can also be transmitted to the outside via the air encompassing the semiconductor chip 12 and 22. However, there is not enough space for the air convection between the semiconductor chip and the carrier 11 so that the heat transmission by air convection is not good. Thus the efficiency of heat dissipation for a semiconductor package is lowered.

Therefore, providing another thermal enhance package to solve the mentioned-above disadvantages is the most important task in this invention.

SUMMARY OF THE INVENTION

In view of the above-mentioned problems, an objective of this invention is to provide a thermal enhance package with a universal heat spreader having through holes and heat transmission pins plugged into the through holes.

To achieve the above-mentioned objective, a thermal enhance package with a universal heat spreader is provided, wherein the thermal enhance package comprises a carrier, a semiconductor chip, and a universal heat spreader. The semiconductor chip is electrically connected to the carrier in a flip-chip fashion and the universal heat spreader is disposed on the semiconductor chip. Therein the universal heat spreader has a plurality of through holes to improve the efficiency of heat transmission by air convection. In addition, a heat transmission pin is provided to plug in one of the through holes to increase the area for heat dissipation and to upgrade the efficiency of the heat transmission.

Accordingly, the heat arisen out of the semiconductor chip is transmitted to the outside by the through holes so as to upgrade the efficiency of air convection and heat transmission and to prevent more and more heat from being accumulated in the semiconductor chip. In such a manner, the semiconductor chip will be easily damaged by accumulating more heat therein. Besides, a heat transmission pin is plugged in one of the through holes so as to adjust the thermal resistance according to the package design.

BRIEF DESCRIPTION OF THE DRAWINGS

The invention will become more fully understood from the detailed description given herein below illustrations only, and thus are not limitative of the present invention, and wherein.

DETAILED DESCRIPTION OF THE INVENTION

The thermal enhance semiconductor package with a universal heat spreader having through holes and heat transmission pins plugged in the through holes according to the preferred embodiment of this invention will be described herein below with reference to the accompanying drawings, wherein the same reference numbers refer to the same elements.

Figure 1:
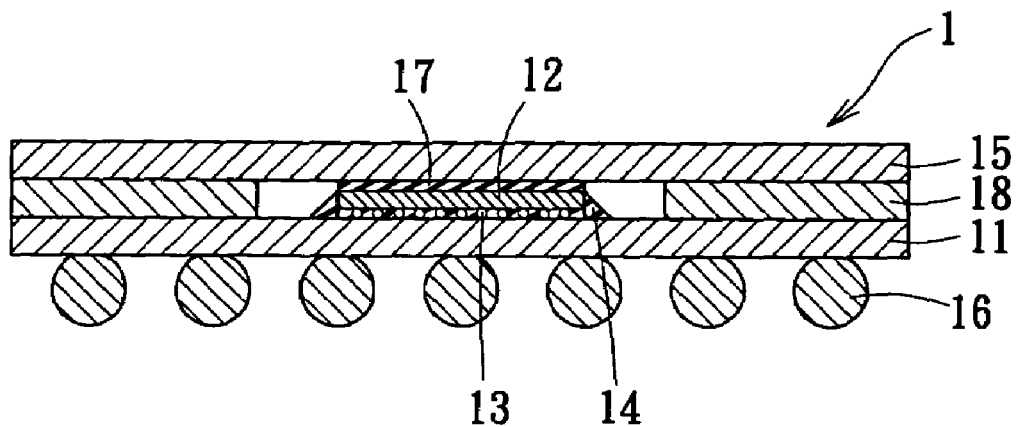
FIG. 1 is a cross-sectional view of the conventional HFC-BGA (high performance flip chip ball grid array) package.
Figure 2:
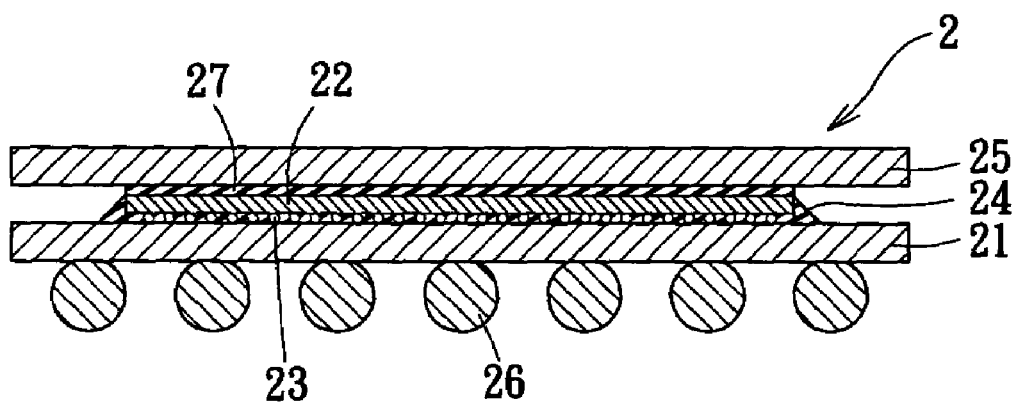
FIG. 2 is a cross-sectional view of a conventional ball grid array package with a heat spreader.
Figure 3:
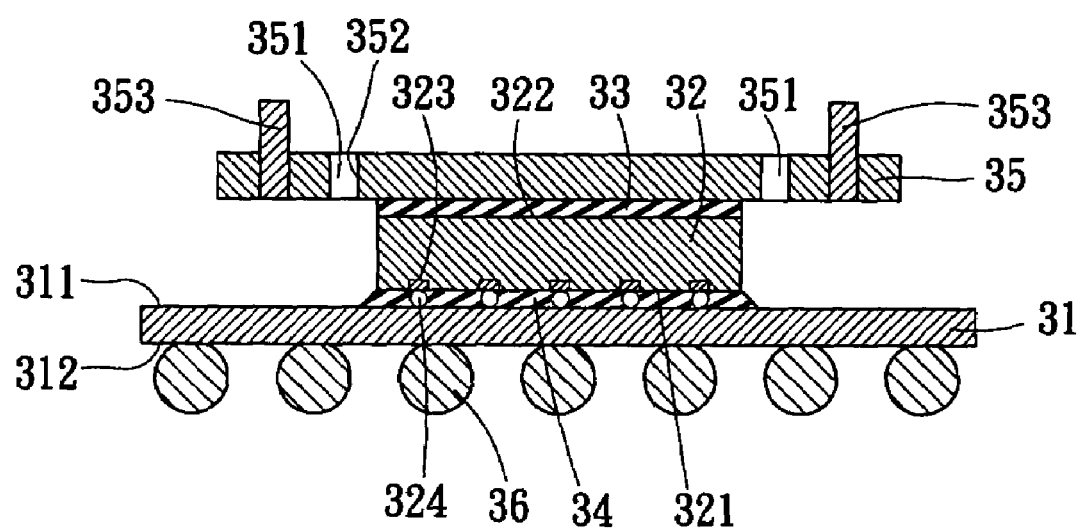
FIG. 3 is a cross-sectional view of a thermal enhance semiconductor package according to the first embodiment of the present invention.

In accordance with a first preferred embodiment as shown in FIG. 3, there is provided a thermal enhance semiconductor package with a universal heat spreader. The thermal enhance semiconductor package mainly comprises a carrier 31, a semiconductor chip 32, a heat transmission adhesive 33, an underfill 34 and a universal heat spreader 35. The carrier 31, for example a substrate and a lead frame, has an upper surface 311 and a lower surface 312 opposed to the upper surface 311. The semiconductor chip 32 has an active surface 321 and a back surface 322 opposed to the active surface 321. Therein a plurality of bonding pads 323 are formed on the active surface 321, a plurality of conductive devices 324, such as conductive bumps, metal bumps or solder bumps, are disposed on the bonding pads 323, a universal heat spreader 35 with flat shape is disposed on the back surface 322 by the heat transmission adhesive 33, and the active surface 321 of the semiconductor chip 32 faces the upper surface 311 of the carrier 31 and are electrically connected to the upper surface 311 via the conductive devices 324.

As mentioned above, the heat transmission adhesive 33 can be a glue, a flexible film, or a tape for connecting the universal heat spreader 35 and the semiconductor chip 32, and for transmitting the heat arisen from the semiconductor chip 32 to the outside.

It should be noted that the universal heat spreader 35 has a plurality of through holes 351 for upgrading the efficiency of the heat transmission by air convection so that the heat can be transmitted to the outside more quickly. Therein the though holes 351 can be formed by the method of mechanical drilling and laser ablating. When the material of the universal heat spreader 35 is aluminum, the inner walls 352 of the through holes can be plated with a conductive layer, for example a copper layer or a silver layer. Besides, at least one heat transmission pin 353 is provided to be plugged and fixed in one of the through holes 351 by a heat transmission adhesive (not shown), for example an adhesive with high thermal conductivity. Accordingly, the area for heat dissipation is increased. In addition, a metal layer is provided on the outer surface of the heat transmission pin 353, for example a copper layer or a silver layer, so as to upgrade the efficiency of heat transmission. However, the location for disposing the heat transmission pin 353 can be adjusted according to the package design to achieve the designed thermal resistance.

Moreover, the coefficient of thermal expansion for the carrier 31 is not in compliance with the coefficient for the semiconductor chip 32 so as to lower the effect of the CTE (coefficient of the thermal expansion) mismatch and to prevent the package from being affected by the thermal stress caused by CTE mismatch by filling an underfill between the semiconductor chip 32 and the carrier 31. In addition, a solder ball 36 is mounted on the lower surface 312 of the carrier 31 so as to electrically connect the semiconductor package to another external electronic devices.

Figure 4:
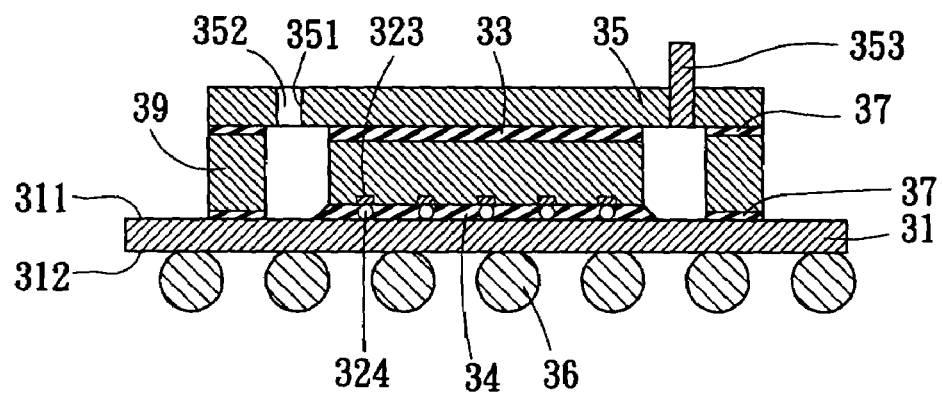
FIG. 4 is a cross-sectional view of a thermal enhance semiconductor package according to the second embodiment of the present invention.

Next, referring to FIG. 4, a stiffener ring 39 is disposed around the semiconductor chip 32 and mounted on the carrier 31 to connect the carrier 31 and the heat spreader 35 so as to support the universal heat spreader 35 and to prevent the universal heat spreader 35 being tilted and deformed.

Figure 5:
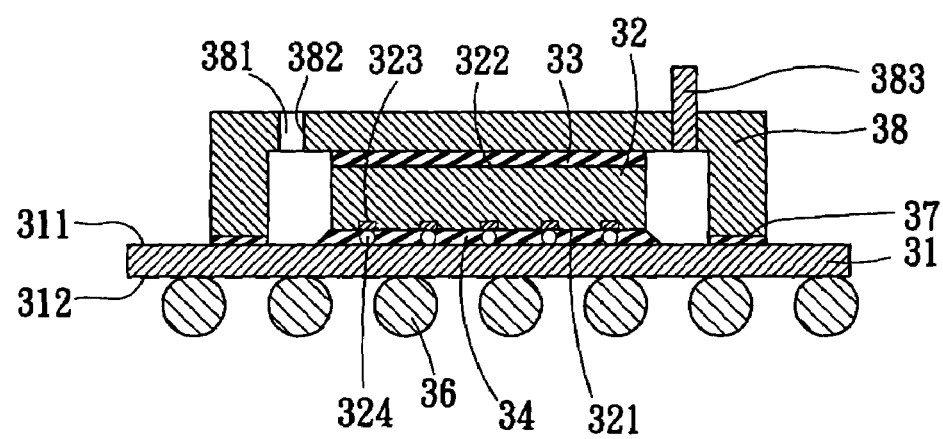
FIG. 5 is a cross-sectional view of a thermal enhance semiconductor package according to the third embodiment of the present invention.

Now, referring to FIG. 5, this invention further comprises a universal heat spreader 38 formed into a cap shape. The universal heat spreader 38 with a cap shape is mounted onto the back surface 322 of the semiconductor chip 32 and the upper surface 311 of the carrier 31 via a heat transmission adhesive 37. Similarly, the universal heat spreader 38 with a cap shape also has a plurality of through holes 381 formed therein. Therefore, the heat arisen out of the semiconductor chip 32 is not only transmitted to the outside by conduction through the heat transmission adhesive 37, the universal heat spreader 38 with a cap shape and the carrier 31 but also by air convection via through holes so that the efficiency of the heat transmission can be upgraded. Moreover, as mentioned above, a heat transmission pin 383 is provided to plug in one of the through holes 381 in order to increase the areas for heat dissipation. Besides, a metal layer, for example a copper layer and a silver layer, is provided on the outer wall of the heat transmission pin 383 to upgrade the heat transmission efficiency. It should be noted that the location for disposing the heat transmission pin 383 can be adjusted according to the package design to achieve the designed thermal resistance. It also should be noted that the reference numeral of each element in FIGS. 4 and 5 corresponds to the same reference numeral of each element in FIG. 3.

Although the invention has been described in considerable detail with reference to certain preferred embodiments, it will be appreciated and understood that various changes and modifications may be made without departing from the spirit and scope of the invention as defined in the appended claims.

What is claimed is:

1. A thermal enhance semiconductor package, comprising:
   a carrier having an upper surface and a lower surface opposed to the upper surface;
   a semiconductor chip having an active surface and a back surface opposed to the active surface, wherein the semiconductor chip further comprises a plurality of bonding pads formed on the active surface;
   a plurality of conductive devices, connecting the bonding pads and the upper surface of the carrier; and
   a universal heat spreader disposed on the back surface of the semiconductor chip and having an outer surface and an inner surface, wherein the inner surface of the universal heat spreader faces the back surface of the semiconductor chip, and the universal heat spreader further comprising:
   a plurality of through holes passing through the outer surface and the inner surface of the universal heat spreader; and
   a plurality of heat transmission pins disposed in one region of the through holes;
   wherein air convection is provided via the other region of the through holes that are completely empty, and the heat is transferred from the inside of the thermal enhance semiconductor package to the outside of the thermal enhance semiconductor package.

2. The thermal enhance semiconductor package of claim 1, further comprising a copper layer formed on an outer surface of the heat transmission pin.

3. The thermal enhance semiconductor package of claim 2, wherein a material of the universal heat spreader comprises copper or aluminum.

4. The thermal enhance semiconductor package of claim 3, further comprising a copper layer formed on an inner wall of the through holes.

5. The thermal enhance semiconductor package of claim 1, further comprising a silver layer formed on an outer surface of the heat transmission pin.

6. The thermal enhance semiconductor package of claim 5, wherein a material of the universal heat spreader comprises copper or aluminum.

7. The thermal enhance semiconductor package of claim 6, further comprising a copper layer formed on an inner wall of the through holes.

8. The thermal enhance semiconductor package of claim 1, further comprising a heat transmission adhesive formed between the back surface of the semiconductor chip and the inner surface of the universal heat spreader.

9. The thermal enhance semiconductor package of claim 1, further comprising a stiffener ring connecting the carrier and the universal heat spreader via a heat transmission adhesive.

10. The thermal enhance semiconductor package of claim 9, wherein the stiffener ring is disposed surrounding the semiconductor chip.

11. The thermal enhance semiconductor package of claim 1, further comprising an underfill disposed between the upper surface of the carrier and the active surface of the semiconductor chip.

12. The thermal enhance semiconductor package of claim 1, wherein one of the conductive devices is a conductive bump.

13. The thermal enhance semiconductor package of claim 1, wherein a plurality of solder balls are formed on the lower surface of the carrier.

14. A thermal enhance semiconductor package, comprising:
   a carrier having an upper surface and a lower surface opposed to the upper surface;
   a semiconductor chip having an active surface and a back surface opposed to the active surface, wherein the semiconductor chip further comprises a plurality of bonding pads formed on the active surface;
   a plurality of conductive devices, connecting the bonding pads and the upper surface of the carrier; and
   a universal heat spreader disposed on the back surface of the semiconductor chip and having an outer surface and an inner surface, wherein the inner surface of the universal heat spreader faces the back surface of the semiconductor chip, and the universal heat spreader further comprising:
   a plurality of through holes passing through the outer surface and the inner surface of the universal heat spreader; and
   a plurality of heat transmission pins disposed in one region of the through holes to increase the area for heat dissipation, wherein the disposing location of the heat transmission pins is adjustable to achieve the designed thermal resistance;
   wherein air convection is provided via the other region of the through holes that are completely empty, and the heat is transferred from the inside of the thermal enhance semiconductor package to the outside of the thermal enhance semiconductor package.

15. The thermal enhance semiconductor package of claim 14, wherein the heat transmission pin has an outer surface and a copper layer is formed on the outer surface.

16. The thermal enhance semiconductor package of claim 14, further comprising a heat transmission adhesive formed between the back surface of the semiconductor chip and a surface of the universal heat spreader.

17. The thermal enhance semiconductor package of claim 14, further comprising a stiffener ring connecting the carrier and the universal heat spreader via a heat transmission adhesive.

18. The thermal enhance semiconductor package of claim 14, further comprising an underfill disposed between the upper surface of the carrier and the active surface of the semiconductor chip.

19. The thermal enhance semiconductor package of claim 14, wherein one of the conductive device is a conductive bump.

20. The thermal enhance semiconductor package of claim 14, wherein a plurality of solder balls are formed on the lower surface of the carrier.

* * * * *